United States Patent [19]

Shimamura et al.

[11] Patent Number: 5,004,498

[45] Date of Patent: Apr. 2, 1991

[54] DISPERSION STRENGTHENED COPPER ALLOY AND A METHOD OF MANUFACTURING THE SAME

[75] Inventors: Keizo Shimamura, Kawasaki; Kagetaka Amano, Atsugi; Tatsuyoshi Aisaka, Ebina; Satoshi Hanai; Kohsoku Nagata, both of Yokohama, all of Japan

[73] Assignee: Kabushiki Kaisha Toshiba, Kawasaki, Japan

[21] Appl. No.: 419,103

[22] Filed: Oct. 10, 1989

[30] Foreign Application Priority Data

| Oct. 13, 1988 | [JP] | Japan | 63-257685 |
| Oct. 27, 1988 | [JP] | Japan | 63-269328 |
| Oct. 27, 1988 | [JP] | Japan | 63-269329 |
| Oct. 27, 1988 | [JP] | Japan | 63-269330 |
| Oct. 27, 1988 | [JP] | Japan | 63-269331 |
| Oct. 27, 1988 | [JP] | Japan | 63-269333 |

[51] Int. Cl.$^5$ .................................................. C22C 29/12
[52] U.S. Cl. ........................................ 75/233; 75/234; 75/235; 75/236; 75/238; 75/241; 75/244; 419/12; 419/13; 419/14; 419/15; 419/16; 419/17; 419/19; 419/23; 428/552
[58] Field of Search .................. 419/19, 20, 12, 13, 419/14, 15, 16, 17, 23; 75/232, 233, 234, 235, 236, 238, 241, 244; 428/552

[56] References Cited

U.S. PATENT DOCUMENTS

| 3,024,110 | 3/1962 | Funkhauser et al. | 75/206 |
| 3,069,759 | 12/1962 | Grant et al. | 29/182.5 |
| 3,143,789 | 8/1964 | Iler et al. | 29/182.5 |
| 3,158,473 | 11/1964 | Gatti | 419/19 |
| 3,180,727 | 4/1965 | Alexander et al. | 419/19 |
| 3,492,113 | 1/1970 | Shafer et al. | 75/5 |
| 3,574,609 | 4/1971 | Finlay et al. | 75/153 |
| 3,779,714 | 12/1973 | Nadkarni et al. | 75/206 |
| 3,922,180 | 11/1975 | Fuchs et al. | 148/11.5 R |

FOREIGN PATENT DOCUMENTS

| 144959 | 6/1985 | European Pat. Off. . |
| 62-93321 | 4/1987 | Japan . |
| 64-83629 | 3/1989 | Japan . |
| 1172813 | 12/1969 | United Kingdom . |

OTHER PUBLICATIONS

*Transactions of the Metallurgical Society of AIME*, vol. 221, Apr. 1961, "Dispersion Strengthening in the Copper-Alumina System", pp. 371-377.

Chemical Abstracts, vol. 89, No. 20, 13th Nov. 1978, p. 263, Col. 1, Abstract No. 167715m, Columbus, Ohio, US; G. Yamauchi et al.: "On the Spacing Parameters of Dispersion Alloys", & Trans. Jpn. Soc. Compos. Mater., 1977, 3(1-2), 45-52.

*Primary Examiner*—Stephen J. Lechert, Jr.
*Assistant Examiner*—Leon Nigohosian, Jr.
*Attorney, Agent, or Firm*—Oblon, Spivak, McClelland, Maier & Neustadt

[57] ABSTRACT

A dispersion strengthened copper alloy containing a copper matrix, and dispersion particles dispersed in the copper matrix within a range of 0.5 to 6 vol %. In this alloy, an average diameter of a matrix region where the dispersion particles are not present is 0.3 μm or less, and the total amount of solid solution elements contained in the copper matrix is determined such that, when this amount of the solid solution elements is added to pure copper, the electric conductivity of the matrix is lowered by 5% IACS or less.

15 Claims, 3 Drawing Sheets

DISPERSION STRENGTHENED COPPER ALLOY AND A METHOD OF MANUFACTURING THE SAME

BACKGROUND OF THE INVENTION

1. Field of the Invention

The present invention relates to a dispersion strengthened copper alloy and a method of manufacturing the same, wherein particles are dispersed in a copper matrix, and, to various applications of this dispersion strengthened copper alloy.

2. Description of the Related Art

There is now an increased demand for an copper alloy having both a high electric conductivity and a high mechanical strength, which is applicable to a coil material for generating a high magnetic field, a semiconductor lead frame, or a spot-welding electrode. However, it is very difficult to obtain a copper alloy having a high electric conductivity and a high mechanical strength, which are incompatible with each other.

There is known a dispersion strengthened copper alloy in which dispersion particles are dispersed in a copper matrix, as a copper alloy having relatively high electric conductivity and mechanical strength. In this dispersion strengthened copper alloy, very fine particles are uniformly dispersed in a copper matrix in order to attain the two incompatible characteristics.

As a method of manufacturing the dispersion strengthened copper alloy, there is known a technique wherein powder for copper matrix and powder for dispersion particles are pulverized and mixed by using a mixer such as a ball mill. However, in the case of the dispersion strengthened copper alloy, it is very difficult to disperse the dispersion particles finely and uniformly by this method. Consequently, the obtained copper alloy has a low strength.

As another method of manufacturing the dispersion strengthened copper alloy, there is proposed an internal oxidation method (USP 3,779,714). In this method, powder of an alloy consisting of copper and an element which is more easily oxidized than the copper are heated in a oxidizing atmosphere, and the surface area of the powder is oxidized. The oxidized powder is sealed in a container and heated, so that oxygen existing in the surface area of the powder is diffused inwards. Thus, powder of an alloy, in which oxide particles of the added element are internally dispersed, can be obtained. According to this method, a dispersed strengthened copper alloy in which fine dispersion particles are uniformly dispersed in a copper matrix can be obtained.

In this method, however, a very long time is taken in the internal oxidation process in which the oxygen existing in the surface area of the alloy particles is diffused inwards and the added element is completely oxidized. Thus, part of the added element is not oxidized and may remain in the copper matrix as a solid solution element. If the part of the added element remains in the copper matrix as the solid solution element, the electric conductivity of the dispersion strengthened copper alloy is considerably lowered. If an amount of the dispersion particles is decreased so as to increase the electric conductivity, the strength of the alloy is lowered.

As still another method of manufacturing the dispersion strengthened copper alloy, there is known a mixed oxide reduction method, which is described, for example, Trans. AIME, vol. 218 (1960), p. 775, Lecture of Powder Metallurgy Technique No. 9, ed. Shadan-hojin Powder Metallurgy Technique Association, Powder Metallurgy Applied Product (IV)—Special Material—(1964), p. 6, Nikkan Kogyo Shinbunsha Shuppan, or Published Unexamined Japanese Patent Application (PUJPA) No. 62-93321. In this method, a metal oxide of a matrix and raw material for dispersion particles are pulverized and mixed. In the resulting mixture, only the metal oxide of the matrix is reduced, and a mixture of a metal and dispersion particles is prepared. Thereafter, the mixture is sintered by a normal powder metallurgical method, thus obtaining a dispersion strengthened alloy.

The mixed oxide reduction method is advantageous only where it is applied to the manufacture of a dispersion strengthened alloy, the matrix of which is formed of nickel or silver. However, when this method is applied to the manufacture of a dispersion strengthened copper alloy wherein a copper oxide is employed as a oxide for a metal matrix, it is difficult to uniformly disperse fine dispersion particles in the matrix. Thus, this method is unsuitable for obtaining a high-strength dispersion strengthened copper alloy.

SUMMARY OF THE INVENTION

The present invention has been devised in consideration of the above circumstances, and its object is to provide a dispersion strengthened copper alloy having both a high electric conductivity and a high strength, and a method of manufacturing the dispersion strengthened copper alloy with simple steps.

A dispersion strengthened copper alloy of the present invention contains a copper matrix, and dispersion particles dispersed in the copper matrix within a range of 0.5 to 6 vol %, wherein an average diameter of a matrix region where the dispersion particles are not present is 0.3 $\mu$m or less, and the total amount of solid solution elements contained in the copper matrix is determined such that, when this amount of the solid solution elements is added to pure copper, the electric conductivity of the matrix is lowered by 5% IACS or less.

Also, a method of manufacturing a dispersion strengthened copper alloy comprises:
- a mixed powder forming step of mechanically pulverizing and mixing a copper oxide, and a raw material for dispersion particles which is chemically stabler than the copper oxide in a reducing atmosphere;
- a reducing step of selectively reducing the copper oxide contained in the resulting mixed powder;
- a shaping step of shaping the selectively reduced mixed powder; and
- a sintering step of sintering the shaped body obtained by the shaping step and forming a sintered body containing a copper matrix and dispersed particles, wherein said reducing step is carried out, while said mixed powder is being kept at a temperature not higher than 1065° C.

The present invention can provide a dispersion strengthened copper alloy having both high electric conductivity and high strength, and a method of manufacturing the dispersion strengthened copper alloy with simple steps and with excellent reproducibility.

DETAILED DESCRIPTION OF THE PREFERRED EMBODIMENTS

Embodiments of the present invention will now be described in detail.

As described above, the dispersion strengthened copper alloy of the present invention comprises a copper matrix and dispersion particles dispersed in the copper matrix, the amount of the dispersion particles being 0.5 to 6 vol %. An average diameter of a matrix region where dispersion particles do not exist is 0.3 μm or less. The total amount of solid solution element included in the copper matrix is determined such that, when the solid solution element is added to pure copper, the electric conductivity of the copper alloy is lowered by 5% IACS or less.

The dispersion particles are for example, particles one, or two or more, selected from the group consisting of aluminum oxide, zirconium oxide, titanium oxide, silicon oxide, magnesium oxide, yttrium oxide, chromium oxide, aluminum nitride, titanium nitride, boron nitride, titanium carbide, boron carbide, titanium boride, etc. These elements may be used singly or in combination.

It is well known that solid solution element in a copper matrix considerably lowers the electric conductivity of the copper alloy. It is thus necessary that the total amount of the solid solution element in the copper matrix be limited within a range in which the electric conductivity is lowered by an allowable degree. In other words, if the electric conductivity is lowered by 5% IACS or more only by the presence of the solid solution element in the matrix, the electric conductivity would be more lowered by the presence of dispersion particles in the matrix. Consequently, the electric conductivity of the dispersion strengthened copper alloy becomes insufficient. Because of this, the total amount of solid solution element in the matrix is determined, as defined above.

Figure 1:
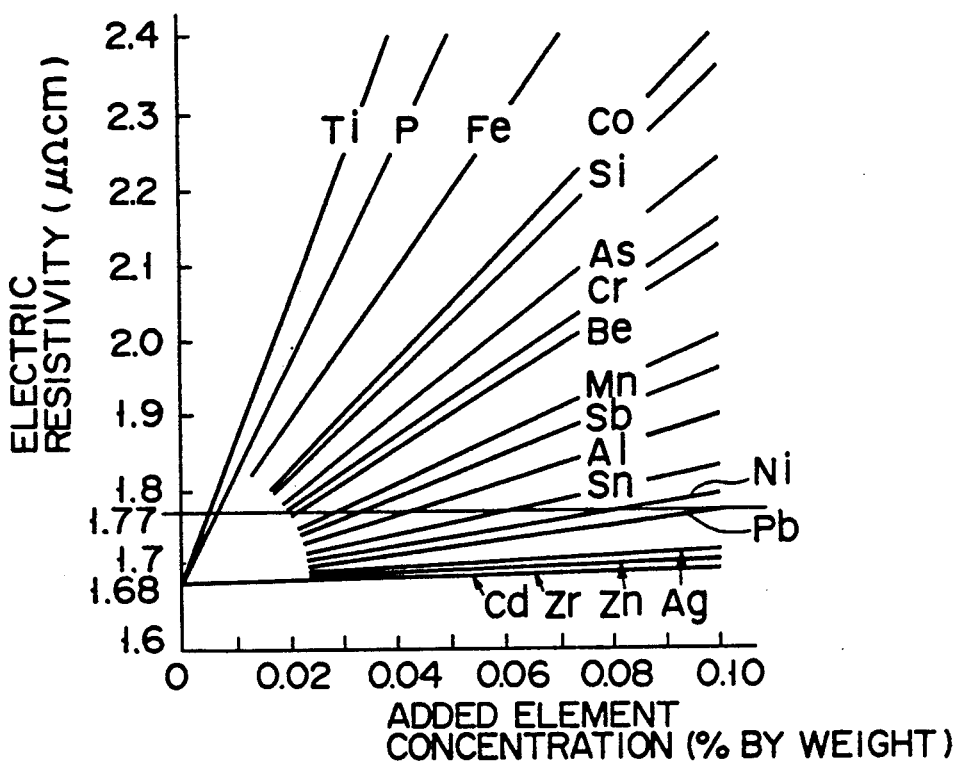
FIG. 1 shows a relationship between the amount of each of solid solution elements added to copper and electric resistance.

The degree of lowering of electric conductivity is varied by the type of solid solution element. It is known that the relationship between the amount of solid solution element and electric resistance is established, as shown in FIG. 1 (P. Pawlek and K. Reichel: Z. Metallk., 47(1956), 347). The electric resistivity of OFHC oxygen free copper (pure copper) is 1.68 Ωμcm., and the electric conductivity thereof is 102% IACS. Thus, when the electric conductivity is lowered by 5% IACS than that of pure copper, the electric resistivity becomes 1.77 Ωμcm. From FIG. 1, a maximum amount (at which the electric resistivity becomes 1.77 Ωμcm) of each element may be found, as shown in Table 1.

TABLE 1

| Element | Al | Si | Ti | Fe | Cr | Be | Mn | Sb | Sn | Ni | Pb | Ag |
|---|---|---|---|---|---|---|---|---|---|---|---|---|
| % by Weight | 0.04 | 0.014 | 0.005 | 0.009 | 0.019 | 0.02 | 0.026 | 0.032 | 0.075 | 0.072 | 0.1 | 0.7 |

In particular, dispersion particles of aluminum oxide are desirable. When the dispersion particles of aluminum oxide are used, it is desirable that the amount of aluminum in a copper matrix, as a solid solution element is limited to 0.04% by weight or less. The reason for this is that, if the amount of aluminum as a solid solution element in the copper matrix exceeds 0.04% by weight, the electric conductivity of the matrix is lowered by 5% IACS or more only by the presence of the solid solution, and the electric conductivity of the resulting dispersion strengthened copper alloy is considerably lowered.

The content of the dispersion particles in the copper matrix is determined in the range defined above, because 0.5 vol % or less of dispersion particles is insufficient to raise the 0.2% proof stress of the dispersion strengthened copper alloy up to 40 kg/mm² or more, and because 6 vol % or more of dispersion particles cannot raise the electric conductivity of the dispersion strengthened copper alloy up to 85% or more and makes it difficult to perform secondary processing.

In the copper alloy of the present invention, it is necessary that an average diameter of a copper matrix region where dispersion particles do not exist is 0.3 μm or less. If the average diameter exceeds 0.3 μm, the tensile strength and the 0.2% proof stress of the copper alloy are considerably deteriorated.

Figure 2:
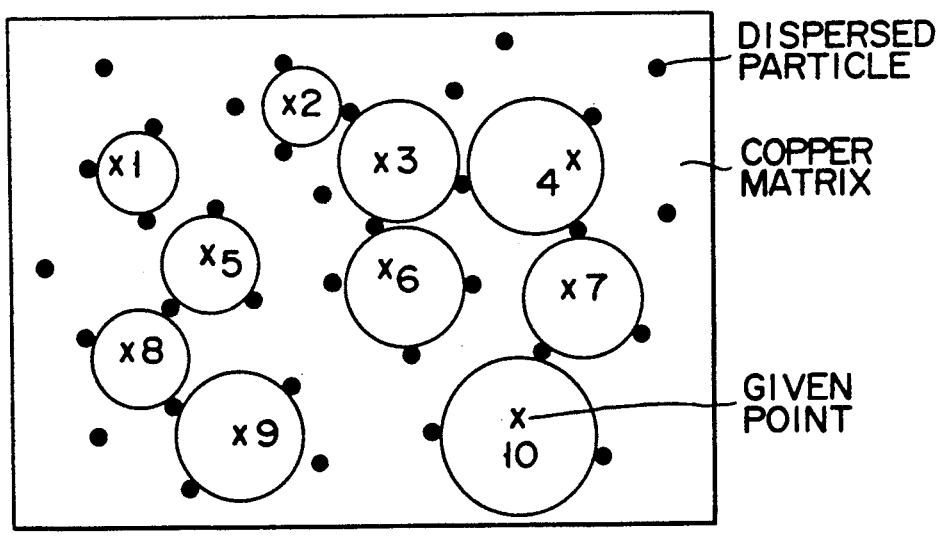
FIG. 2 is a schematic view for illustrating a method of measuring an average diameter of a copper matrix region.

The average diameter of the copper matrix region is determined as follows. A thin film test piece is prepared from a sample of a dispersion strengthened copper alloy. A photograph of 100,000 magnifications of the thin film test piece is obtained by a transmission type electron microscope. As shown in FIG. 2, given ten points, which do not overlap the dispersion particles, are chosen. Ten largest circles each of which includes one of the given ten points and does not include the dispersion particles are described (the given ten points are not necessarily the centers of the corresponding circles). An average value of the diameters of these circles is considered an average diameter of a copper matrix region where dispersion particles are not present.

A method of manufacturing the dispersion strengthened copper alloy of the present invention will now be described.

At first, a copper oxide serving as a raw material of a copper matrix is prepared, and also a raw material of dispersion particles which are chemically stabler than the copper oxide in a reducing atmosphere are prepared. The copper oxide is cuprous oxide (Cu₂O), cupric oxide (CuO), or a nonstoichiometric copper oxide (CuOx). In the view point of the uniform dispersion of dispersion particles, it is desirable that the particle diameter of copper oxide be 5 μm or less, preferably 1 μm or less.

Any type of dispersion particles, which are chemically stabler than a copper oxide in a reducing atmosphere, may be used. For example, the dispersion particles are particles of one, or two or more, selected from the group consisting of aluminum oxide, zirconium oxide, titanium oxide, silicon oxide, magnesium oxide, yttrium oxide, chromium oxide, aluminum nitride, titanium nitride, boron nitride, titanium carbide, boron carbide, and titanium boride, as mentioned above. It is desirable that the particle diameter of the dispersion particle be 1 $\mu$m or less, preferably 0.05 $\mu$m or less, since the dispersion particles need be uniformly dispersed in the copper matrix. When the dispersion particles of aluminum oxide are used, a $\gamma$-crystal type aluminum oxide or an amorphous aluminum oxide is suitable.

The copper oxide serving as the raw material of copper matrix and the raw material of dispersion particles are mixed such that 0.5 to 6 vol % of dispersion particles are contained in the copper matrix after the copper oxide is reduced. Thereafter, the resulting mass is mechanically pulverized and mixed. Since the copper oxide (powder) is fragile, it is easily pulverized. Thus, the diameter of the resulting mixed powder becomes 0.05 $\mu$m or less, and the average diameter becomes 0.01 $\mu$m to 0.02 $\mu$m.

The pulverizing/mixing of the mixture is performed by a conventional mixing device such as a ball mill or an attritor. In this case, it is desirable that a container or a ball employed is formed of non-metallic material. If a metallic container or ball is used for pulverizing/mixing, metal such as iron may be included in the mixture and the electric conductivity of an obtained dispersion strengthened copper alloy is considerably deteriorated.

Then, the resulting mixture powder is inserted into a reducing furnace kept in a reducing atmosphere, and the copper oxide in the mixture powder is selectively reduced. Thus, the copper oxide is reduced to metal copper. This reducing step may employ either reducing gas or a solid reducing agent. In the case of the reduction using gas, thermal treatment is carried out in an atmosphere of a reducing gas such as hydrogen gas. In the case of the reduction using a solid reducing agent, a solid reducing agent such as carbon is added while the copper oxide and dispersion particles are mixed, and the resulting mass is subjected to thermal treatment for reduction in a reducing atmosphere or an inert atmosphere. In this case, it should be noted that an optimal amount of solid reducing agent must be added. If an insufficient amount of solid reducing agent is added, oxygen remains in an obtained alloy and the electric conductivity of the alloy is lowered. On the other hand, if the amount of added solid reducing agent is excessive, the solid reducing agent remains in an obtained alloy, and the processability of the alloy in a secondary process such as a rolling process is degraded.

This reducing process is performed in an atmosphere having such a reducing potential that the copper oxide in the mixture powder can be reduced to the state of metal copper but the dispersion particles are not reduced to the state of metal. However, it is not necessary to employ a reducing atmosphere wherein the dispersion particles are not reduced at all. For example, there is no problem if the dispersion particle, e.g., $TiO_2$, is reduced to TiO.

In the reducing process, it is necessary to keep the entire mixture powder at a temperature equal to or lower than 1065° C. or an eutectic temperature of copper and copper oxide, until the reduction of the copper oxide is completed. If the temperature of only a portion of the mixture powder exceeds 1065° C., an average diameter of a copper matrix region where dispersion particles are not present exceeds 0.3 $\mu$m, resulting in a nonuniform structure of copper alloy. Consequently, the strength of the copper alloy is considerably lowered.

As stated above, various methods may be employed to keep the mixture powder at a temperature not higher than 1065° C. For example, in a reducing reaction of copper oxide with hydrogen, a large quantity of heat is generated. Thus, the heating temperature for heating the reducing furnace is kept low, and the partial pressure and flow rate of the reducing gas and, if necessary, the partial pressure and flow rate of other gas mixed in the reducing gas, are controlled. Thus, the quantity of heat generated per unit time in the reducing reaction is kept low, and the mixture powder is kept at a temperature not higher than 1065° C. Under this condition, the reducing process is carried out. Once the reduction of the copper oxide is completed, a large quantity of heat is no longer generated. Thus, even if the heating temperature for heating the reducing furnace is raised to some extent, as long as the heating temperature is not higher than 1065° C., the temperature of the mixture powder does not exceed 1065° C.

After the above-described reducing process a shaped body of the mixture powder is produced by a given shaping method. The shaped body is sintered in a reducing or inert atmosphere, and a dispersion strengthened copper alloy in which the dispersion particles are dispersed in the copper matrix can be produced. The shaping and sintering of the mixture powder may be carried out simultaneously by a hot press method, thereby to form the dispersion strengthened copper alloy. In addition, it is possible to insert the mixture powder in a mold prior to the reducing process, and subject the mixture powder to a hot press process in atmosphere in which only the copper oxide can be selectively reduced, thus carrying out the reducing, shaping, and sintering steps simultaneously thereby to obtain the dispersion strengthened copper alloy.

The dispersion strengthened copper alloy obtained by the above-described process can be used as it is, or may be subjected to a secondary process, if necessary. The copper alloy of this invention has an excellent processability in a secondary process.

The present invention can provide a dispersion strengthened copper having both a high strength and a high electric conductivity. Namely, in room temperature, the 0.2% proof stress is 40 kg/mm$^2$ or more, and the electric conductivity is 85% IACS or more. In particular, by using aluminum oxide as dispersion particles and setting the quantity of aluminium as a solid solution element in the copper matrix to 0.04% by weight or less, a dispersion strengthened copper alloy having more excellent strength and electric conductivity can be obtained.

According to the method of this invention of manufacturing the dispersion strengthened copper alloy, the copper oxide and the copper produced by reduction can be prevented from melting by an eutectic reaction. Thus, agglomeration or n increase in size of the dispersion particles can be prevented. As a result, the average diameter of the copper matrix region where the dispersion particles are not present can be reduced to 0.3 $\mu$m or less. According to this method, the dispersion strengthened copper alloy having the above-described features and having the structure wherein the dispersion particles are uniformly dispersed in the copper matrix can be manufactured easily and with good reproducibility. Note that the diameter of the dispersion particles of dispersion strengthened copper alloy manufactured by abovementioned process is 0.005 μm to 0.05 μm.

The dispersion strengthened copper alloy according to the present invention is applicable for various purposes.

A description will now be given of a high magnetic field generating coil formed of the dispersion strengthened copper alloy of the present invention.

Recently, there is an increased demand for generation of a high magnetic field to be applied to an MRI, nuclear fusion, magnetic floating railway, or measurement of physical properties. For producing such a high magnetic field, a superconducting coil which consumes no electric power has been widely used. However, the superconducting coil cannot produce a high magnetic field which exceeds a critical magnetic field of this. Thus, in order to produce a high magnetic field exceeding a limit of a superconducting coil, a normal conductive coil must be partly used in the magnetic field generating coil. The material constituting such a normal conductive coil needs to have high electric conductivity, high thermal conductivity and high strength. In other words, in order to produce a high magnetic field, a large electric current is caused to flow through the coil, and a large quantity of Joule heat is produced in the normal conductive coil. Thus, the coil material needs to have high electric conductivity and high thermal conductivity, in order to reduce the quantity of produced heat and immediately radiate the produced heat into a coolant such as cooling water. Also, the coil must have sufficient strength in order to withstand a large electromagnetic force produced by a large electric current.

The dispersion strengthened copper alloy of the present invention have both high electric conductivity and high strength, as described above. Also, since this copper alloy has a high thermal conductivity inherently, a coil for generating a high magnetic field formed of the dispersion strengthened copper alloy of the present invention has very excellent characteristics.

The coil for generating a high magnetic field according to the present invention can be manufactured by subjecting the dispersion strengthened copper alloy manufactured by the above process, as it is, to plastic deformation or machining. Alternatively, the coil can be manufactured, if necessary, by subjecting the copper alloy to a secondary process and/or a thermal treatment, and then to plastic deformation or machining.

Since the dispersion strengthened copper alloy constituting the coil has high elongation and high shock resistance, the coil may be used not only for a normal magnet driven by a normal current, but also for a pulse magnet driven by a pulse current or a quasi-pulse magnet. Since the coil of this invention maintains high strength and high electric conductivity at a room temperature or a temperature higher than room temperature, this coil is applicable to a coil for a molten metal electromagnetic pump.

Then, a description will now be given of an electrode used for performing resistance welding (hereinafter, referred to as "resistance welding electrode"), which is formed of the dispersion strengthened copper alloy of the present invention.

It is required that the resistance welding electrode have high thermal conductivity, high electrical conductivity, high strength, and high thermal resistance. In order to meet this requirement, a copper alloy, which is mixed with a small amount of an alloy element such as tungsten, cadmium, chromium or zirconium for increasing strength and thermal resistance, has conventionally been employed as a material of the resistance welding electrode. Recently, a resistance welding process has remarkably been automated and it is repeated at very high speed. This being the case, the condition under which a workpiece is subjected to resistance welding becomes very severe. A conventional resistance welding electrode, which is made of a known copper alloy, does not have sufficient thermal resistance, and it is deformed due to a short-period use. In order to perform high-precision resistance welding, it is thus necessary to subject the conventional electrode to corrective machining, or to replace the electrode with a new one frequently. This deteriorates the productivity of resistance welding.

As described above, the dispersion strengthened copper alloy of the present invention has high electric conductivity and high strength, and also inherently has high thermal conductivity and high thermal resistance. Thus, the resistance welding electrode formed of this copper alloy can withstand an repeated and rapid a resistance welding process which has a high cycling rate.

The resistance welding electrode of the present invention can be manufactured by subjecting the dispersion strengthened copper alloy produced by the above-described method to machining, or, if necessary, by subjecting the copper alloy to a secondary process and/or a thermal treatment, and then to plastic deformation or machining.

A composite superconducting wire formed of the dispersion strengthened copper alloy of the present invention will now be described.

The composite superconducting wire is composed of a metallic base material and a superconducting core wire. The superconducting core wire is formed of an alloy superconductor such as Nb-Ti-based alloy, a compound superconductor such as $Nb_3Sn$, or an oxide superconductor such as YBCO. The metallic base material is formed of Cu, A , Ag, Au, Nb, Ta, Cu-Ni, or Cu-Sn. Among the elements constituting the metallic base material, A , Cu, Ag and Au serve as a stabilizing members of the superconducting core wire. Conventionally, the materials of the metallic base material has low work-hardening properties and low softening temperature. Thus, it is necessary to reinforce the metallic base material by adding thereto a material such as stainless steel which is non-magnetic at low temperature and has a relatively high strength. In addition, since the metallic base material has low softening temperature, it is difficult to integrating the metallic base material and the superconductor having a relatively high hardness. As a result, non-uniform deformation occurs in the resulting composite wire while the wire is subjected to working, resulting in non-uniformity in cross section area of the superconducting core wire, or breaking of the core wire.

In order to overcome these problems, it is proposed to use a dispersion strengthened copper alloy, which may have high electric conductivity and high strength, as the base material of a composite superconducting wire (Published Unexamined Japanese Patent Applications (PUJPA) Nos. 61-264609 and 63-53811). In this technique, the base material serves both as a reinforcing material and a stabilizing material for the composite superconducting wire. However, as described above, in the conventional dispersion strengthened copper alloy, high strength and high electric conductivity are not compatible. In addition, this conventional copper alloy has an undesirably low residual resistance ratio (RRR). Thus, the conventional dispersion strengthened copper alloy is not satisfactory as the base material of the composite superconducting wire.

In contrast, the dispersion strengthened copper alloy of the present invention has both high electric conductivity and high strength, as described above. Thus, if the copper alloy of this invention is used as the base material of the composite superconducting wire, the copper alloy exhibits satisfactory characteristics as a reinforcing material and a stabilizing material for the composite superconducting wire.

The composite superconducting wire of the present invention is characterized by comprising a base material formed of the dispersion strengthened copper alloy of the present invention, and a superconducting core wire arranged in the base material. This composite superconducting wire has excellent characteristics.

This composite superconducting wire can be manufactured as follow. At first, the dispersion strengthened copper alloy manufactured by the above-described method is, as it is, if necessary subjected to machining, or subjected to a secondary process and/or thermal treatment, and then subjected to machining, thus obtaining the base material. Then, the base material and the superconducting core wire are integrated by given means. In this case, the superconducting core wire is coated with the dispersion strengthened copper alloy serving as the base material, thus forming the composite superconducting wire. Alternatively, the superconducting core wire is coated with the dispersion strengthened copper alloy, and then the resulting body is subjected to other processing, thus forming the composite superconducting wire. It is also possible that a material, which becomes superconducting by heat treatment, is used as the material of the core wire, and, after the material of the core wire is coated with the dispersion strengthened copper alloy, the combined body is subjected to other processing. Then, the resulting body is subjected to heat treatment so that the material of the core wire is covered to the superconducting material, thus forming the composite superconducting wire. The thus obtained composite superconducting wire may be coated with stainless steel or the like. Also, it is possible to coat the superconducting core wire with copper in advance, and then to further coat the resulting body with the dispersion strengthened copper alloy of the present invention. The composite superconducting wire of the present invention is not limited to the structure wherein the superconducting core wire is concentrically coated with the dispersion strengthened copper alloy. A plurality of superconducting core wires may be provided. For example, the base material of the dispersion strengthened copper alloy may be arranged, directly or via other metal, on superconducting core wires arranged in a flat-plate-like manner.

A high electric conductivity spring formed of the dispersion strengthened copper alloy of the present invention will now be described.

A high electric conductivity type spring used in electric and electronic devices such as a connector, a switch, a relay, a slip ring, etc. needs to have high electric conductivity, high thermal conductivity, high strength, high thermal resistance, high platability, high bondability with an electrode, high slidability (wear resistance), and high spring properties. As a material of an electrically conductive spring, which meets the above requirements, a copper alloy (phosphor bronze including 4.2 to 9% Sn, 0.03 to 0.3% P) defined in class 2 and class 3 of JIS (Japanese Industrial Standard) has been used. However, in accordance with recent developments in the field of semiconductors, which accelerate high integration and miniaturization of elements, an electrically conductive spring used in various electric and electronic devices needs to have a smaller size and a higher performance. Consequently, the electrically conductive spring needs to have higher electrical conductivity and higher strength. A material of such an electrically conductive spring is disclosed, for example, in Published Unexamined Japanese Patent Application (PUJPA) No. 53-14612. This document teaches the use of a beryllium (Be) alloy. Beryllium, however, has toxicity and is not easily subjected to a precipitation hardening process. Thus, the use of beryllium is restricted, and the electrical conductivity of beryllium is inadequate.

In contrast, the dispersion strengthened copper alloy of the present invention has high electrical conductivity and high strength, as described above. In addition, this copper alloy has other characteristics required for a high electrical conductivity spring. Thus, the spring formed of the dispersion strengthened copper alloy of the present invention has very excellent characteristics as a high electrical conductivity spring.

This spring can be manufactured in a similar manner to the manner in which the above-described magnetic field generating coil. Namely, the dispersion strengthened copper alloy is, as it is, subjected to plastic deformation or machining, or, if necessary, subjected to a secondary process and/or thermal treatment, and then to plastic deformation or machining. Thus, the high electrical conductivity type spring is obtained.

Next, a lead frame formed of the dispersion strengthened copper alloy of the present invention will now be described.

A lead frame used in a semiconductor device needs to have high thermal conductivity, high electric conductivity, high strength, high thermal resistance, and high platability. As a material of a lead frame which meets these requirements, an Fe-Ni alloy and a copper alloy are mainly used. The Fe-Ni alloy includes kovar and Fe-42Ni, which have high strength, high thermal resistance and high platability. The copper alloy includes phosphor bronze, CA194, and CA195, which have high electric conductivity and high platability. However, in accordance with recent developments in the field of semiconductors, which facilitate high integration and reduction in size of elements, the lead frame is required to have higher strength, higher thermal conductivity and higher electric conductivity. The above-mentioned materials cannot meet these requirements.

In contrast, the dispersion strengthened copper alloy of the present invention has high electric conductivity and high strength, as described above, and also has other characteristics required for the lead frame. Thus, the lead frame formed of the dispersion strengthened copper alloy of the present invention has very excellent characteristics.

In the above-described applications of the present invention, if a dispersion strengthened copper alloy manufactured by a conventional internal oxidation method is used as material, part of the dispersion particles is not oxidized by a long-time diffusion process and remains in the copper matrix. Consequently, the part of the dispersion particles is present in the copper matrix as a solid solution element. Thus, the electric conductivity of the obtained alloy becomes insufficient.

EXAMPLES

Examples of the present invention will now be described.

At first, the conditions for manufacturing an alloy will be described with reference to examples 1 to 9 included within the scope of the present invention, and controlls 1 to 9 not included within the scope of the invention.

EXAMPLES 1 to 9

As a material of a matrix, powder of cupric oxide having a particle diameter of 1 μm was used. The cupric oxide powder was mixed with raw materials of dispersion particles, i.e., aluminum oxide powder (γ-type, α-type, amorphous), zirconium oxide powder, yttrium oxide powder an silicon nitride powder. The ratio of each of the materials of dispersion particles to copper after reduction ranged from 0.5 to 6 vol %, thus preparing 9 types of powder mixtures. Table 2, shown below, shows types, particle diameters, and mixed amounts of the dispersion particles. The powder mixtures were pulverized and mixed in a dry-type method for four days in a ball mill composed of a container and a ball made of aluminum oxide.

Each of the pulverized and mixed powder mixtures was charged in an alumina boat. A Pt/(Pt-Rh) thermocouple protected by a sheath having a diameter of 0.5 mm and made of a thermal resistant alloy was put in five locations in the powder mixture, to measure a local temperature rise in the powder mixture while the powder mixture is being reduced in a flow of mixed gas of argon and hydrogen. The reduction was started from 200° C. The mixing ratio of argon to hydrogen was set to 5:1 (volume ratio) at a flow rate of 3 l/min (20° C., 1 atm.) so that the maximum local temperature of the powder mixture would not exceed 1065° C. Finally, the temperature rose to 900° C. (500° C. in Example 1 only). After the temperature reached 900° C., the supply of argon was stopped, and the power mixture was kept for one hour in a flow of pure hydrogen at a flow rate of 3 l/min. After all of the powder mixtures were cooled, 9 types of dispersion strengthened copper alloy powders obtained by the reduction were filled in carbon molds, and subjected to a hot press process in a vacuum, under a pressure of 400 kg/cm² at a temperature of 900° C. Thus, billets of the dispersion strengthened copper alloys were manufactured.

Controlls 1 to 3

As a material of a matrix, powder of cupric oxide having a particle diameter of 1 μm was used. The cupric oxide powder was mixed with a raw material of dispersion particles, i.e., aluminum oxide powder having a particle diameter of 0.05 μm. The ratios of aluminum oxide powder to copper obtained after reduction were 1.5 vol %, 3.0 vol % and 6.0 vol %. Thus, three types of powder mixtures were obtained. Billets of three types of dispersion strengthened copper alloys were manufactured in the same method as in Example 1, excepting that, in the reducing process, the mixed gas of argon and hydrogen, the mixing ratio of which is 1:3, was supplied at a flow rate of 5 l/min. In the reducing process, the maximum temperature of the powder mixtures locally exceeded 1065° C.

Controlls 4 to 6

As a material of a matrix, powder of cupric oxide having a particle diameter of 1 μm was used. The cupric oxide powder was mixed with a raw material of dispersion particles, i.e., aluminum oxide powder having a particle diameter of 0.05 μm. The ratios of aluminum oxide powder to copper obtained after reduction were 0.3 vol %, 7.5 vol % and 10.0 vol %. Thus, three types of powder mixtures were obtained. Billets of three types of dispersion strengthened copper alloys were manufactured in the same method as in Example 1.

Controll 7

As a material of a matrix, pure copper powder having a particle diameter of 5 μm was used. The pure copper powder was mixed with 3 vol % of material of dispersion particles, i.e., aluminum oxide powder having a particle diameter of 0.05 μm, thus preparing a powder mixture. The powder mixture was pulverized and mixed in a dry-type method for four days in a ball mill composed of a container and a ball made of aluminum oxide.

The pulverized and mixed powder mixture was inserted in an alumina boat, and reduced for one hour at 900° C. in a flow of mixed gas of argon and hydrogen, the mixing ratio of which is 5:1 (volume ratio), at a flow rate of 3 l/min (20° C., 1 atm.). After the powder mixture was cooled, it was filled in a carbon mold and subjected to a hot press process in a vacuum at a temperature of 900° C. under a pressure of 400 kg/cm². Thus, a billet of dispersion strengthened copper alloy was manufactured.

With respect to the billets of dispersion strengthened copper alloys of Examples 1 to 9 and controlls 1 to 7, the electric conductivity at room temperature of each billet was measured. Also, by using a sample cut out from each billet, the tensile strength, and the 0.2% proof stress and elongation at room temperature were measured. The electric conductivity was measured by using a SIGMA TEST (tradename) 2.067-061, manufactured by INSTITUT DR.FORSTER (West Germany).

Further, the amount of solid solution metal element constituting dispersion particles in a copper matrix, and the amount of other solid solution elements were measured. The measurement of the amount of solid solution elements in the copper matrix was performed in the following manner. The sample of each dispersion strengthened copper alloy was heated and solved in a mixed solution of aqueous ammonia and hydrogen peroxide. Dispersion particles insoluble in the mixed solution were precipitated. The precipitate was filtered through a filter having two 0.05 μm-filter components. The filtered liquid was subjected to an quantitative analysis by an absorptiometric method. In this way, the amount of solid solution was measured. After the measurement of the amount of solid solution, an alloy of the same composition as that of the matrix was prepared, and the electric conductivity thereof was measured. Thus, the degree of lowering in electric conductivity of the matrix due to the solid solution elements was found. In this case, the electric conductivity was measured by using the above-mentioned SIGMA TEST, and the degree of lowering in electric conductivity was measured with reference to 102 % IACS which is the electric conductivity of oxygen free copper.

Furthermore, as described above, a thin film test piece is prepared from a sample of a dispersion strengthened copper alloy. A photograph of 100,000 magnifications of the thin film test piece is obtained by a transmission type electron microscope. Then, as shown in FIG. 2, given ten points, which do not overlap the dispersion particles, are chosen. Ten largest circles each of which includes one of the given ten points and dose not include the dispersion particles are described (the given ten points are not necessarily the centers of the corresponding circles). An average value of the diameters of these circles is considered an average diameter of a copper matrix region where dispersion particles are not present. In controlls 1, 2, 3 and 7, since structures are large, photographs of 5,000 magnifications were employed.

Table 2 shows the conditions and measured values regarding Examples 1 to 9 and controlls of 1 to 7.

As controlls 8 and 9, commercially available round bars of two types of alumina dispersion strengthened copper alloys (aluminum oxide contents: 1.5 vol % and 3.0 vol %) which were manufactured by an internal oxidation method. Regarding these round bars, similar experiments were conducted. The results of the experiments were also shown in Table 2. In addition, Table 2 shows maximum local temperatures during reduction.

TABLE 2

| | | Matrix Powder | Type of Dispersion Particles | Diameter of Dispersion Particles (μm) | *Mixed Amount of Dispersion Particles (vol %) | Electric Conductivity (% IACS) | Tensile Strength (kg/mm²) | 0.2% Proof Stress (kg/mm²) | Elongation (%) |
|---|---|---|---|---|---|---|---|---|---|
| Examples | 1 | Cupric Oxide | Aluminium Oxide (γ Type) | 0.05 | 0.5 | 96.2 | 44 | 40 | 29 |
| | 2 | Cupric Oxide | Aluminium Oxide (γ Type) | " | 1.5 | 95.8 | 46 | 41 | 28 |
| | 3 | Cupric Oxide | Aluminium Oxide (γ Type) | " | 3.0 | 90.5 | 55 | 51 | 17 |
| | 4 | Cupric Oxide | Aluminium Oxide (γ Type) | " | 6.0 | 85.3 | 60 | 54 | 14 |
| | 5 | Cupric Oxide | Aluminium Oxide (Amorphous) | 0.015 | 3.0 | 91.0 | 52 | 49 | 18 |
| | 6 | Cupric Oxide | Aluminium Oxide (α Type) | 0.6 | 3.0 | 93.2 | 44 | 40 | 26 |
| | 7 | Cupric Oxide | Ziroconium Oxide | 0.08 | 3.0 | 91.7 | 43 | 40 | 20 |
| | 8 | Cupric Oxide | Yttrium Oxide | 0.12 | 3.0 | 91.1 | 53 | 48 | 17 |
| | 9 | Cupric Oxide | Silicon Nitride | 0.09 | 3.0 | 89.3 | 48 | 45 | 21 |
| Controlls | 1 | Cupric Oxide | Aluminium Oxide (γ Type) | 0.05 | 1.5 | 97.0 | 28 | 22 | 38 |
| | 2 | Cupric Oxide | Aluminium Oxide (γ Type) | " | 3.0 | 93.8 | 32 | 26 | 32 |
| | 3 | Cupric Oxide | Aluminium Oxide (γ Type) | " | 6.0 | 88.2 | 36 | 29 | 25 |
| | 4 | Cupric Oxide | Aluminium Oxide (γ Type) | " | 0.3 | 98.4 | 31 | 25 | 46 |
| | 5 | Cupric Oxide | Aluminium Oxide (γ Type) | " | 7.5 | 78.6 | 62 | 56 | 12 |
| | 6 | Cupric Oxide | Aluminium Oxide (γ Type) | " | 10.0 | 70.3 | 65 | 63 | 5 |
| | 7 | Pure Copper | Aluminium Oxide (γ Type) | " | 3.0 | 91.2 | 33 | 27 | 32 |
| | 8 | Alumina dispersion strengthened copper alloy obtained by internal oxidation method | | | 1.5 | 85.0 | 45 | 38 | 16 |
| | 9 | Alumina dispersion strengthened copper alloy obtained by internal oxidation method | | | 3.0 | 78.0 | 52 | 44 | 10 |

| Maximum local temperature during reduction (°C) | Amount of solution of metallic element constituting dispersion particles in matrix (wt. %) | Total amount of solid solution of other element in matrix (wt. %) | Lowering of electric conductivity of matrix due to solid solution element (% IACS) | Average diameter of copper region where dispersion particles are not present (μm) |
|---|---|---|---|---|

TABLE 2-continued

|  |  |  |  |  |  |  |
|---|---|---|---|---|---|---|
| Examples | 1 | 500 | 0.002 | 0.021 | 2.3 | 0.18 |
|  | 2 | 900 | 0.002 | 0.018 | 2.1 | 0.11 |
|  | 3 | 900 | 0.002 | 0.017 | 2.0 | 0.082 |
|  | 4 | 900 | 0.003 | 0.017 | 2.1 | 0.069 |
|  | 5 | 900 | 0.003 | 0.016 | 2.1 | 0.092 |
|  | 6 | 900 | 0.001 | 0.012 | 1.5 | 0.25 |
|  | 7 | 900 | 0.005 | 0.025 | 2.3 | 0.21 |
|  | 8 | 900 | 0.003 | 0.015 | 2.4 | 0.12 |
|  | 9 | 900 | 0.007 | 0.017 | 3.7 | 0.17 |
| Controlls | 1 | 1180 | 0.003 | 0.022 | 2.3 | 22 |
|  | 2 | 1125 | 0.002 | 0.019 | 2.2 | 13 |
|  | 3 | 1090 | 0.002 | 0.020 | 2.0 | 5 |
|  | 4 | 900 | 0.001 | 0.018 | 2.1 | 0.29 |
|  | 5 | 900 | 0.003 | 0.019 | 2.5 | 0.054 |
|  | 6 | 900 | 0.003 | 0.019 | 2.8 | 0.047 |
|  | 7 | 900 | 0.002 | 0.024 | 2.9 | 3 |
|  | 8 | — | 0.08 | 0.021 | 10.3 | 0.075 |
|  | 9 | — | 0.13 | 0.024 | 16.0 | 0.043 |

The mixed amount of dispersion particles, calculated as a volume percentage in reduced copper As seen from Table 2, regarding the dispersion strengthened copper alloys of Controlls 1 to 9, those having the 0.2% proof stress of 40 kg/mm² at room temperature do not have the electric conductivity of 85% IACS or more at room temperature. On the other hand, those having the electric conductivity of 85% IACS or more at room temperature do not have the 0.2% proof stress of 40 kg/mm² or more at room temperature.

In contrast, the dispersion strengthened copper alloys of Examples 1 to 9 have the electric conductivity of 85% IACS or more at room temperature and the 0.2% proof stress of 40 kg/mm² or more at room temperature. It was confirmed that these copper alloys had both high electric conductivity and high strength.

Samples cut out from the billets of the dispersion strengthened copper alloys of Examples 2 to 4 and controlls 5 and 9 were subjected to a cold rolling process. The draft percentages at the time cracks are produced were measured, and the results are shown in Table 3.

TABLE 3

|  | Draft Percentage at the Time Cracks are Produced |
|---|---|
| Example 2 | 99 |
| Example 3 | 97 |
| Example 4 | 72 |
| Controll 5 | 28 |
| Controll 9 | 33 |

As seen from Table 3, in Examples 2 to 4, the draft percentages at the time cracks are produced are high, and the processability in a secondary process is excellent. In contrast, In controlls 5, and 9 the draft percentages are low, and the processability in the secondary process is low.

A description will now be given of an example of a high magnetic field generating coil formed of the dispersion strengthened copper alloy according to the present invention.

At first, a billet of a dispersion strengthened copper alloy was manufactured in the same method as in Example 3, that the flow rate of a mixed gas and the flow rate of pure hydrogen in the reducing process were set to 20 l/min. The reason why the flow rate of pure hydrogen was increased was that the amount of row material charged in an alumina boat. Regarding this billet, the electric conductivities at room temperature and at 550° C., and the thermal conductivity at room temperature were measured. A sample for a test of tensile strength is cut out of the billet. Concerning this sample, the 0.2% proof stress, tensile strength and elongation at room temperature and at 550° C. were measured. The measured values are shown in Table 4.

Figure 3:
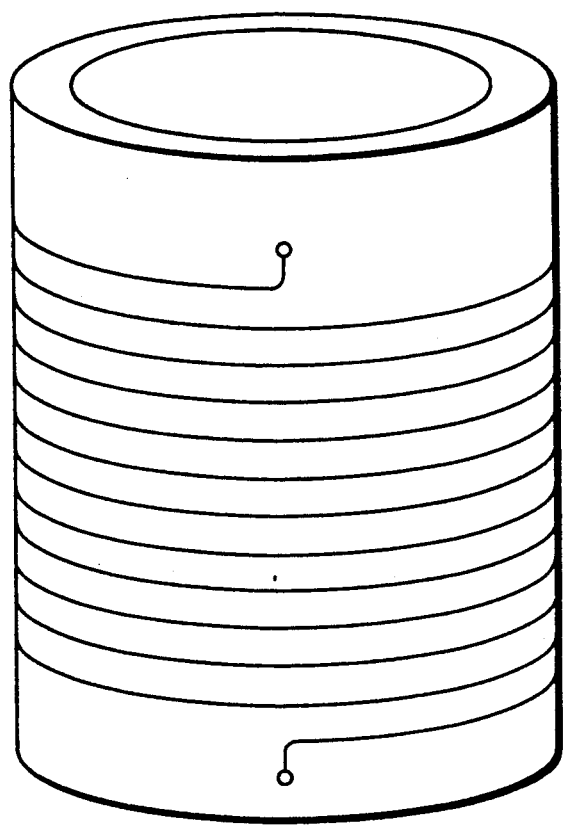
FIG. 3 shows a magnetic field generating coil according to an embodiment of the present invention.

Then, the billet is machined into a cylinder having the outer diameter of 165 mm, the inner diameter of 88 mm and the height of 125 mm. Further, the cylinder was subjected to electro spark machining, and a spiral through-slit was cut therein. Thus, as shown in FIG. 3, a magnetic field generating coil with 11 turns was manufactured. The coil (a water cooled magnet) was placed in a water cooling container of stainless steel, and was installed within a superconducting magnet which generates a magnetic field of 14.3 T (tesla). While the coil was cooled by supplying high-pressure water to the water cooling container, the coil was supplied with a direct current of 10,500 A. At this time, the magnetic flux density in a central region of the water cooled magnet was 23.2 T. After the magnetic field was generated, the coil was taken out and was examined, and it was found that no crack or deformation occurred in the coil.

In a controll, a commercially available alumina dispersion strengthened copper alloy manufactured by an internal oxidation method (the aluminum oxide content: 0.9 vol %; the amount of aluminium solid solution in a copper matrix: 0.07% by weight) was used. The copper alloy was subjected to a thermal treatment for one hour at 900° C. in a flow of pure argon. Then, a coil of the same shape as that of the above example was manufactured, and a similar experiment of magnetic field generation was conducted. A direct current of 10,500 A was caused to flow through the coil, and the magnetic flux density of 23.0 T was measured. After the generation of the magnetic field, the coil was taken out and examined. A considerable deformation occurred in the coil.

Regarding this controll, like in the above example, the electric conductivity, thermal conductivity, 0.2% proof stress tensile strength, and elongation of the copper alloy were measured before the coil was formed of the alloy. The measured values are shown in Table 4.

TABLE 4

|  | Example | | Controll | |
|---|---|---|---|---|
|  | Room Temperature | 550° C. | Room Temperature | 550° C. |
| Electric Conductivity (% IACS) | 90.5 | 32.1 | 89.2 | 30.4 |
| Thermal | 370 | — | 344 | — |

TABLE 4-continued

|  | Example | | Controll | |
|---|---|---|---|---|
|  | Room Temperature | 550° C. | Room Temperature | 550° C. |
| Conductivity (W/mK) |  |  |  |  |
| Tensile Strength (kg/mm$^2$) | 55 | 31 | 39 | 21 |
| 0.2% Proof Stress | 51 | 27 | 30 | 16 |
| Elongation (%) | 17 | 4 | 18 | 4 |

An example of a resistance welding electrode formed of the dispersion strengthened copper alloy of the present invention will now be described.

A billet of the dispersion strengthened copper alloy was prepared, in the same manner as in Example 3. The billet was processed into a round bar by a cold grooved roll process. The electric conductivity, thermal conductivity, tensile strength, elongation and Vickers hardness of the round bar were measured. The measured results are shown in Table 5.

Figure 4:
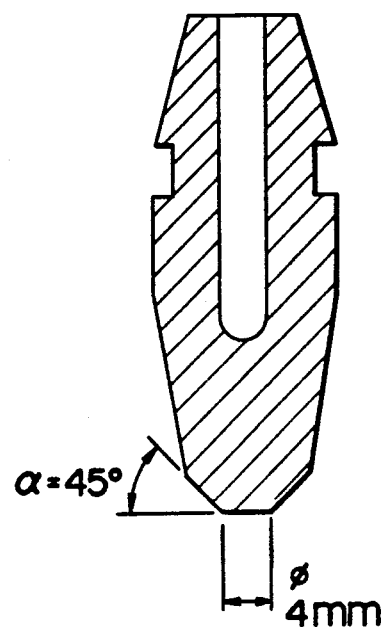
FIG. 4 is a cross section of an electrode to be subjected to resistance welding, according to an embodiment of the present invention.

The round bar was subjected to mechanical machining, to manufacture an electrode, as shown in FIG. 4. As seen from FIG. 4, a tip end portion of the electrode has a truncated-conical shape, with a diameter of 4 mm and an inclination angle $\alpha$ of 45° C. In a test, a steel plate having a thickness of 1 mm was spot-welded by using this electrode, under the conditions that the welding current was 5,500 A and the cycling rate was about 1/sec. As a result of the test, it was found that the tip end portion of the electrode was not deformed even after the welding at 5,000 spots, and the electrode could be used for a further welding process.

In a controll, a billet of a commercially available alumina dispersion strengthened copper alloy (the aluminum oxide content: 3.0 vol %) manufactured by an internal oxidation process was subjected to a cold grooved roll process, thereby to form a round bar. The round bar was machined to form an electrode having the same shape as the electrode of the above example. By using the electrode of the controll, a test of spot welding a steel plate was conducted under the same conditions. As a result of the test, it was found that satisfactory welding was continued until the welding at 4,500 spots. After the welding at 4,500 spots, the tip end portion of the electrode started to be deformed, and an electric current per unit area was lowered. In this controll the electric conductivity, thermal conductivity, tensile strength, elongation and Vickers hardness of the alloy prior to the formation of the electrode were measured, as in the above example. The measured results are shown in Table 5.

TABLE 5

|  | Example | Controll |
|---|---|---|
| Electric Conductivity (% IACS) | 90 | 76 |
| Thermal Conductivity (W/mK) | 365 | 341 |
| Tensile Strength (kg/mm$^2$) | 63 | 61 |
| Elongation (%) | 4.2 | 3.5 |
| Vickers Hardness (Hv) | 168 | 162 |

A description will now be given of an example of a composite superconducting wire comprising a base material formed of the dispersion strengthened copper alloy of the present invention.

As in Example 3, a billet of the dispersion strengthened copper alloy was prepared. The electric conductivity of the billet at room temperature was measured. A sample was cut out of the billet for a test of tensile strength. The 0.2% proof stress tensile strength and elongation at room temperature of the sample were measured. The measured results are shown in Table 6.

Figure 5:
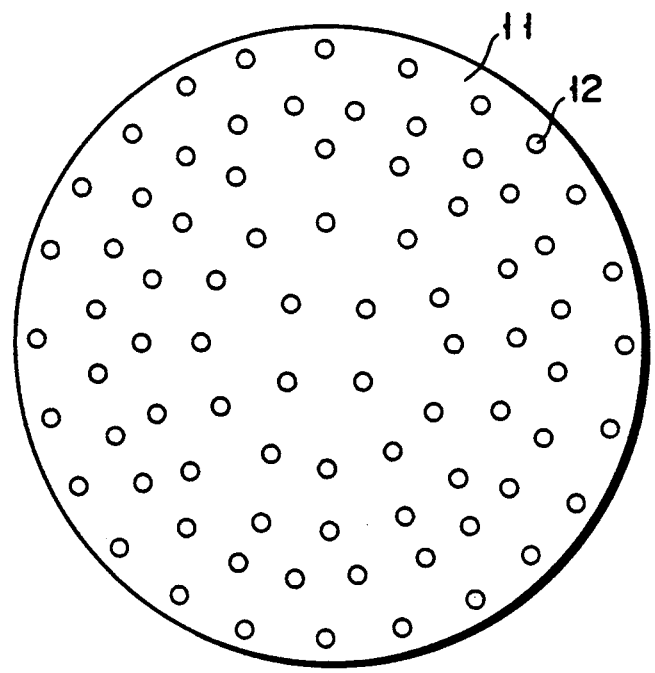
FIG. 5 is a cross section of a composite superconducting wire according to an embodiment of the present invention.

The billet was processed into a round bar having an outer diameter of 45 mm and a length of 120 mm. Then, 80 holes, the diameter of each of which was 3.6 mm, were formed in the round bar, as shown in FIG. 5. Thus, a metallic base material 11 was prepared. Eighty Nb-Ti superconducting members 12 (Ti: 46.5% by weight; Nb: the balance) each having a diameter of 3.55 mm were inserted into the 80 holes of the base material, thus obtaining a composite superconducting wire element. Thereafter, the wire element was repeatedly subjected to normal processing and thermal treatment. Consequently, a composite superconducting wire having a diameter of 0.2 mm was manufactured. The characteristics of this composite superconducting wire are shown in Table 7.

In a controll, a billet of a commercially available alumina dispersion strengthened copper alloy (the aluminum oxide content: 3.0 vol %; the amount of aluminum solid solution in a copper matrix: 0.13% by weight) manufactured by an internal oxidation method was subjected to a thermal treatment for one hour at 900° C. By using the resulting body as a base material, a composite superconducting wire was manufactured in the same manner as in the above example, and the characteristics of the composite superconducting wire were similarly measured. The measured results are shown in Table 7. From Table 7, it was confirmed that the example was superior to the controll with respect to all of the uniformity of filament, critical current density, tensile strength and residual resistance ratio. In particular, a sharp difference was observed in the residual resistance ratio. As in the above example, in the controll, the electric conductivity, tensile strength, 0.2% proof stress and elongation of the base material were measured prior to the manufacture of the composite superconducting wire. The measured results are shown in Table 6.

TABLE 6

|  | Electric Conductivity at Room Temperature (% IACS) | Tensile Strength (kg/mm$^2$) | 0.2% Proof Stress (kg/mm$^2$) | Elongation (%) |
|---|---|---|---|---|
| Example | 90.5 | 55 | 51 | 17 |
| Controll | 78.0 | 52 | 44 | 10 |

TABLE 7

|  | Example | Controll |
|---|---|---|
| Uniformity of | 15.6 ± 0.2 μm | 15.5 ± 0.3 μm |

TABLE 7-continued

| | Example | Controll |
|---|---|---|
| Filament Critical Current Density (A/cm² at 5 T) | $(2.9 \pm 0.08) \times 10^5$ | $(2.8 \pm 0.11) \times 10^5$ |
| Tensile Strength (kg/mm²) | 135 | 110 |
| Residual Resistance Ratio R300K/R10K | 122 | 7 |

An example of a high electric conductivity spring formed of the dispersion strengthened copper alloy of the present invention will now be described.

In the same manner as in Example 3, a billet of the dispersion strengthened copper alloy was prepared, and the billet was subjected to a cold roll process to form a thin plate as a spring sample having a thickness of 0.15 mm. The electric conductivity, thermal conductivity, tensile strength, elongation and micro Vickers hardness of the sample were measured. Further, a spring limit value was measured, and the brazing property (in 650° C.) against an electrode was examined. As a material of the electrode, a composite material of SM476:MoS₂+graphite/Ag was used, and the brazing was conducted on the BAg-1 of the electrode. The results of the test are shown in Table 8.

In a controll A, a billet of a commercially available alumina dispersion strengthened copper alloy (the aluminum oxide content: 3.0 vol %; the amount of aluminum solid solution in a copper matrix: 0.13% by weight) manufactured by an internal oxidation method was subjected to a cold roll process, thereby obtaining a thin plate having a thickness of 0.15 mm. In controlls B and C., billets of commercially available phosphor bronze (4.5% Sn—0.03% P—Cu) and beryllium copper (1.9% Be—0.2% Co—0.5% Fe—Cu) were subjected to cold rolling, to obtain thin plates each having a thickness of 0.15 mm. The same test as was conducted in the above example was carried out in controlls A to C. The results of the test are shown in Table 8.

As seen from Table 8, the example was superior to controlls A to C with respect to characteristics required for a high electric conductivity type spring.

TABLE 8

| | Example | Controll A | Controll B | Controll C |
|---|---|---|---|---|
| Electric Conductivity (% IACS) | 90 | 75 | 15 | 21 |
| Thermal Conductivity (W/mK) | 370 | 310 | 75 | 92 |
| Tensile Strength (kg/mm²) | 65 | 64 | 62 | 110 |
| Hardness (mHv) | 168 | 162 | 160 | 360 |
| Spring Limit Value (Kb) | 45 | 44 | 42 | 89 |
| Brazing* Property | A | B | C | C |
| Hardness | 168 | 162 | 90 | 130 |

TABLE 8-continued

| | Example | Controll A | Controll B | Controll C |
|---|---|---|---|---|
| after Brazing (mHv) | No Change | No Change | Lowered | Lowered |

*A: strength of brazing portion > 20 kg/mm²
B: strength of brazing portion > 15 kg/mm²
C: strength of brazing portion > 10 kg/mm²

An example of a lead frame formed of the dispersion strengthened copper alloy of the present invention will now be described.

In the same manner as in Example 3, a billet of the dispersion strengthened copper alloy was prepared, and the billet was subjected to a cold roll process, thereby to form a thin plate having a thickness of 0.15 mm. The thin plate was then subjected to a thermal treatment for one hour at 650° C. The electric conductivity, thermal conductivity, tensile strength, elongation and micro Vickers hardness of the resulting plate were measured. The measured results are shown in Table 9.

Subsequently, a lead frame was formed from this thin plate. The lead frame was tested under the condition of practical use. It was found that this lead frame had excellent characteristics.

In a controll, a billet of a commercially available alumina dispersion strengthened copper alloy (the aluminum oxide content: 3.0 vol %) manufactured by an internal oxidation method was subjected to a cold roll process to form a thin plate having a thickness of 0.15 mm. The thin plate was then subjected to a thermal treatment for one hour at 650° C. Like in the above example, the electric conductivity, thermal conductivity, tensile strength, elongation and hardness of the thin plate were measured. The measured results are shown in Table 9. As seen from Table 9, the example was superior to the controll with respect to all characteristics. In addition, a lead frame was formed from the thin plate of the controlls, and this lead frame was tested under the condition of practical use. It was found that the characteristics of this lead frame were inferior to those of the lead frame of the example.

TABLE 9

| | Example | Controll |
|---|---|---|
| Electric Conductivity (% IACS) | 89 | 74 |
| Thermal Conductivity (W/mK) | 360 | 305 |
| Tensile Strength (kg/mm²) | 65 | 62 |
| Elongation (%) | 4.1 | 3.3 |
| Micro Vickers Hardness (mHv) | 170 | 164 |

What is claimed is:

1. A dispersion strengthened copper alloy containing: a copper matrix;
and dispersion particles dispersed in the copper matrix within a range of 0.5 to 6 vol %,
wherein an average diameter of a matrix region where the dispersion particles are not present is 0.3 μm or less, and the total amount of solid solution elements contained in the copper matrix is determined such that, when this amount of the solid solution elements is added to pure copper, the electric conductivity of the matrix is lowered by 5% IACS or less.

2. The dispersion strengthened copper alloy according to claim 1, wherein the 0.2% proof stress at room temperature of the copper alloy is 40 kg/mm$^2$ or more, and the electric conductivity thereof is 85% IACS or more.

3. The dispersion strengthened copper alloy according to claim 1, wherein said dispersion particles are particles of at least one member selected from the group consisting of aluminum oxide, zirconium oxide, titanium oxide, silicon oxide, magnesium oxide, yttrium oxide, chromium oxide, aluminum nitride, silicon nitride, titanium nitride, boron nitride, titanium carbide, boron carbide, and titanium boride.

4. A method of manufacturing a dispersion strengthened copper alloy comprising the following steps:
   mechanically pulverizing and mixing a powder of copper oxide having particle diameters of 5 $\mu\mu$m or less, and a raw material having particle diameters of 1 $\mu\mu$m or less which is chemically more stable than the copper oxide in a reducing atmosphere, to yield a mixed powder having particle diameters of 0.05 $\mu\mu$m or less;
   selectively reducing the copper oxide contained in the resulting mixed powder, while maintaining said mixed powder at a temperature not higher than 1065° C.;
   shaping the selectively reduced mixed powder; and
   sintering the shaped body obtained to form a sintered body containing a copper matrix and dispersed particles.

5. The method according to claim 4, wherein said dispersion particles are particles of at least one member selected from the group consisting of aluminum oxide, zirconium oxide, titanium oxide, silicon oxide, magnesium oxide, yttrium oxide, chromium oxide, aluminum nitride, silicon nitride, titanium nitride, boron nitride, titanium carbide, boron carbide, and titanium boride.

6. The method according to claim 4, wherein said raw material for dispersion particles has a particle diameter of 0.05 $\mu\mu$m or less.

7. The method according to claim 4, wherein said shaping step and said sintering step are simultaneously carried out.

8. The method according to claim 7, wherein said shaping step employs hot press processing.

9. A dispersion strengthened copper alloy produced by a method comprising the following steps:
   mechanically pulverizing and mixing a powder of copper oxide having particle diameters of 5 $\mu\mu$m or less, and a raw material having particle diameters of 1 $\mu\mu$m or less which is chemically more stable than the copper oxide in a reducing atmosphere, to yield a mixed powder having particle diameters of 0.05 $\mu\mu$m or less;
   selectively reducing the copper oxide contained in the resulting mixed powder, while maintaining said mixed powder at a temperature not higher than 1065° C.;
   shaping the selectively reduced mixed powder; and
   sintering the shaped body obtained to form a sintered body containing a copper matrix and dispersed particles.

10. A magnetic field generating coil formed of a dispersion strengthened copper alloy comprising:
    a copper matrix; and
    dispersion particles dispersed in the copper matrix within a range of 0.5 to 6 vol %,
    wherein an average diameter of a matrix region where the dispersion particles are not present is 0.3 $\mu$m or less, and the total amount of solid solution elements contained in the copper matrix is determined such that, when this amount of the solid solution elements is added to pure copper, the electric conductivity of the matrix is lowered by 5% IACS or less.

11. A resistance welding electrode formed of a dispersion strengthened copper alloy containing:
    a copper matrix; and
    dispersion particles dispersed in the copper matrix within a range of 0.5 to 6 vol %,
    wherein an average diameter of a matrix region where the dispersion particles are not present is 0.3 $\mu$m or less, and the total amount of solid solution elements contained in the copper matrix is determined such that, when this amount of the solid solution elements is added to pure copper, the electric conductivity of the matrix is lowered by 5% IACS or less.

12. A composite superconducting wire comprising:
    a base material formed of a dispersion strengthened copper alloy containing a copper matrix, and dispersion particles dispersed in the copper matrix within a range of 0.5 to 6 vol %, wherein an average diameter of a matrix region where the dispersion particles are not present is 0.3 $\mu\mu$m or less, and the total amount of solid solution elements contained in the copper matrix is determined such that, when this amount of the solid solution elements is added to pure copper, the electric conductivity of the matrix is lowered by 5% IACS or less; and
    a superconducting core wire buried in said base material.

13. The composite superconducting wire according to claim 12, wherein said superconducting core wire contains a member selected from the group consisting of an alloy superconducting material, a compound superconducting material, and an oxide superconducting material.

14. A high electrical conductivity spring formed of a dispersion strengthened copper alloy containing:
    a copper matrix; and
    dispersion particles dispersed in the copper matrix within a range of 0.5 to 6 vol %,
    wherein an average diameter of a matrix region where the dispersion particles are not present is 0.3 $\mu$m or less, and the total amount of solid solution elements contained in the copper matrix is determined such that, when this amount of the solid solution elements is added to pure copper, the electric conductivity of the matrix is lowered by 5% IACS or less.

15. A lead frame formed of a dispersion strengthened copper alloy containing:
    a copper matrix; and
    dispersion particles dispersed in the copper matrix within a range of 0.5 to 6 vol %,
    wherein an average diameter of a matrix region where the dispersion particles are not present is 0.3 $\mu$m or less, and the total amount of solid solution elements contained in the copper matrix is determined such that, when this amount of the solid solution elements is added to pure copper, the electric conductivity of the matrix is lowered by 5% IACS or less.

* * * * *